US006496376B1

(12) United States Patent
Plunkett et al.

(10) Patent No.: US 6,496,376 B1
(45) Date of Patent: Dec. 17, 2002

(54) MODULAR BACKPLANE

(76) Inventors: John Plunkett, 6260 Sequence Dr., Suite A, San Diego, CA (US) 92121; Travis Evans, 6260 Sequence Dr., Suite A, San Diego, CA (US) 92121; Mark Perona, 6260 Sequence Dr., Suite A, San Diego, CA (US) 92121; Robert Wilson, 6260 Sequence Dr., Suite A, San Diego, CA (US) 92121

( * ) Notice: Subject to any disclaimer, the term of this patent is extended or adjusted under 35 U.S.C. 154(b) by 0 days.

(21) Appl. No.: 09/586,329

(22) Filed: Jun. 2, 2000

(51) Int. Cl.⁷ .................................................. H05K 7/00
(52) U.S. Cl. ........................ 361/729; 361/792; 361/788; 361/785; 361/789; 439/65
(58) Field of Search ................................ 361/729, 761, 361/788, 810, 720, 803, 686, 784, 785, 789, 792; 439/951, 945, 65

(56) References Cited

U.S. PATENT DOCUMENTS

| | | | |
|---|---|---|---|
| 3,895,266 A | | 7/1975 | Geiger |
| 4,400,049 A | * | 8/1983 | Schuck ........................ 339/176 |
| 4,790,762 A | | 12/1988 | Harms et al. |
| 4,897,054 A | | 1/1990 | Gilissen et al. |
| 4,938,701 A | | 7/1990 | Heberling |
| 4,971,563 A | | 11/1990 | Wells, III |
| 5,006,961 A | * | 4/1991 | Monico ........................ 361/413 |
| 5,031,073 A | * | 7/1991 | Chang ......................... 361/778 |
| 5,263,868 A | | 11/1993 | Renn et al. |
| 5,325,270 A | | 6/1994 | Wenger et al. |
| 5,336,095 A | | 8/1994 | Walburn et al. |
| 5,530,811 A | | 6/1996 | Benton et al. |
| 5,648,891 A | * | 7/1997 | Gierut ......................... 361/788 |
| 5,827,074 A | | 10/1998 | Gatti |
| 6,075,704 A | * | 6/2000 | Amberg et al. ............. 361/736 |
| 6,122,161 A | * | 9/2000 | Gierut ......................... 361/683 |

* cited by examiner

*Primary Examiner*—David Martin
*Assistant Examiner*—Hung Bui
(74) *Attorney, Agent, or Firm*—Thomas J. Tighe

(57) ABSTRACT

A set of modules from which custom passive backplanes can be assembled coplanarly couple together and are mounted on a rigid base plate which holds them coupled and coplanar. Each module has a plurality of orthogonally oriented card connectors. Preferably there is a CPU module into which is plugged a CPU card from which an ISA and a PCI originates. On one edge of the CPU module is an connector communicating with the ISA bus. This connector is for chaining together one or more ISA modules, each of which expands the ISA bus to three more ISA connectors. On an opposite edge of the CPU module is an connector communicating with the PCI bus. This connector is for chaining together one or more PCI modules, either 32-bit or 64-bit, each of which expands the PCI bus to three more PCI connectors. Power and ground can be jumpered from module to module or can be directly connected to any module.

22 Claims, 8 Drawing Sheets

MODULAR BACKPLANE

BACKGROUND OF THE INVENTION

This invention relates in general to electronic "backplanes," as defined below, used in computers, and in particular to a backplane which can be assembled and selectively configured from interconnected printed circuit board modules.

As used herein the term "backplane" in general refers to one or more open-architecture computer signal buses traversing a planar medium and communicating with a plurality of circuit board connectors affixed to the medium.

This invention is very advantageous in the field of microprocessor based computers specially designed for use in industrial applications and mission-critical environments, such as computers designed according to the PICMG (PCI Industrial Computer Manufacturers Group) specification for industrial PCI/ISA passive backplanes. These computers generally have a passive I/O (input/output) backplane into which are plugged a microprocessor (either mounted on a single-board computer circuit card, i.e. a "CPU card", or not), and a variety of add-on circuit cards for communication via the bus(es) with the microprocessor. (Throughout this document PCI and ISA refer respectively to the well known Peripheral Component Interconnect and Industry Standard Adapter standards for personal computer I/O buses.)

The development of PICMG computers based on passive backplane technology has been driven by the needs of the industrial and Computer-Telephony Integration (CTI) markets. Personal computers designed for desktop use are based on motherboard architectures which fail to address a number of important requirements for industrial and CTI use. For example, a motherboard structure is inflexible and may require the replacement of the entire motherboard in order to repair or to upgrade the system. This results in long system downtime which may be tolerable in a system used for office applications, but which is totally unacceptable in a system which controls the core processes on which a manufacturing business depends.

Also, many industrial and CTI applications require a large number of expansion slots for real-world I/O or speech cards. These are not available on motherboard-based computers. Additionally, the overall construction of the motherboard and I/O expansion board system is not designed to cope with the harsh environmental demands of many industrial applications.

A passive backplane architecture solves these problems by completely dispensing with the motherboard. In a passive backplane computer, a system bus is used to couple a plug-in microprocessor with a plurality of plug-in add-on cards. This architecture makes rapid repair by card substitution possible, and system upgrades and changes are greatly simplified, with minimum system downtime.

Because of the advantages of a passive backplane and a plug-in processor, and because there was no configuration standard for PCI buses, a group of industrial computer product vendors, with a long history of developing PC architecture products for industrial use joined forces, and in 1994 they established the PCI Industrial Computer Manufacturers Group (PICMG) with the mission to define an industrial PCI/ISA passive backplane and CPU card interface specification. The result was a comprehensive specification for a passive backplane architecture to support both PCI and ISA I/O buses, the PCI/ISA industrial standard.

Conventionally a PICMG backplane is oriented horizontally, i.e. face up, in a rack-mounted frame and a CPU card plugs vertically into the backplane. When plugged-in, the CPU card is coupled to a plurality of additional ISA and PCI connectors, via the backplane, for communicating with add-on cards. However conventionally the backplane is a single printed circuit board and the number of connectors on it are fixed and thus the expandability of the computer is limited. If a user has filled all the connectors, the user cannot install anymore add-on cards. Also, conventional backplanes have a fixed mix of ISA, PCI and other types of connectors. This further limits the expandability of the computer. If a user has used all the ISA connectors, for example, and wants to add another ISA card, the user must replace the entire backplane with one having a mix of connectors to match the user's needs. Also, a supplier of such computers must make a variety of backplanes available to customers to satisfy their varying requirements.

This invention solves these problems by providing a computer builder with the means to custom assemble backplanes from a relatively small set of modules. The builder can tailor a backplane for a customer. A builder can vary the footprint of the backplane, the mix of connectors, and can even expand a customer's system by retrofit if the customer's system has a preexisting backplane according to this invention.

Other advantages and attributes of this invention will be readily discernable upon a reading of the text hereinafter.

SUMMARY OF THE INVENTION

An object of this invention is to provide a computer backplane comprising an assemblage of interconnected printed circuit boards in a coplanar arrangement.

A further object of this invention is to provide a set of selectable backplane modules from which a backplane can be assembled.

A further object of this invention is to provide a backplane as described above which can be re-configured in the field.

A further object of this invention is to provide a PICMG passive backplane customizable according to a customer's needs.

These objects, and other objects expressed or implied in this document, are accomplished by a modular backplane having a first module comprising: (1) a first circuit board, (2) an orthogonally oriented connector mounted on the first circuit board for coupling an open input/output bus from a central processing unit to the first circuit board, and (3) an edge oriented connector disposed along an edge of the first circuit board, said connector communicating with the input/output bus via the first circuit board; a second module comprising: (1) a second circuit board, (2) a first edge oriented connector disposed along an edge of the second circuit board for coplanarly coupling with the edge oriented connector of the first circuit board to communicate the input/output bus to the second circuit board, and (3) a plurality of orthogonally oriented connectors affixed to the second circuit board and communicating with the input/output bus via the second circuit board; and a base for mechanically supporting the first and second modules in a coupled, coplanar relationship. Preferably the backplane further has a second edge oriented connector disposed along an opposite edge of the second circuit board, the second edge oriented connector communicating with the input/output bus vis the second circuit board, a third module comprising: (1) a third circuit board; (2) a first edge oriented connector disposed along an edge of the third circuit board for coplanarly coupling with the second edge oriented connector of the second circuit board to communicate the input/output bus to the third circuit board; (3) a plurality of orthogonally oriented connectors affixed to the third circuit board and communicating with the input/output bus via the third circuit board; and (4) the base providing support for all three modules in a coupled, coplanar relationship. An embodiment of this invention has a set of modules from which custom passive backplanes can be assembled. The modules coplanarly couple together and are mounted on a rigid base plate which holds them coupled and coplanar. Each module has a plurality of orthogonally oriented card connectors. Preferably there is a CPU module into which is plugged a CPU card from which an ISA bus and a PCI bus originates. On one edge of the CPU module is an connector communicating with the ISA bus. This connector is for chaining together one or more ISA modules, each of which expands the ISA bus to three more ISA connectors. On an opposite edge of the CPU module is an connector communicating with the PCI bus. This connector is for chaining together one or more PCI modules, either 32-bit or 64-bit, each of which expands the PCI bus to three more PCI connectors. Power and ground can be jumpered from module to module or can be directly connected to any module.

DESCRIPTION OF THE PREFERRED EMBODIMENT

Figure 1:
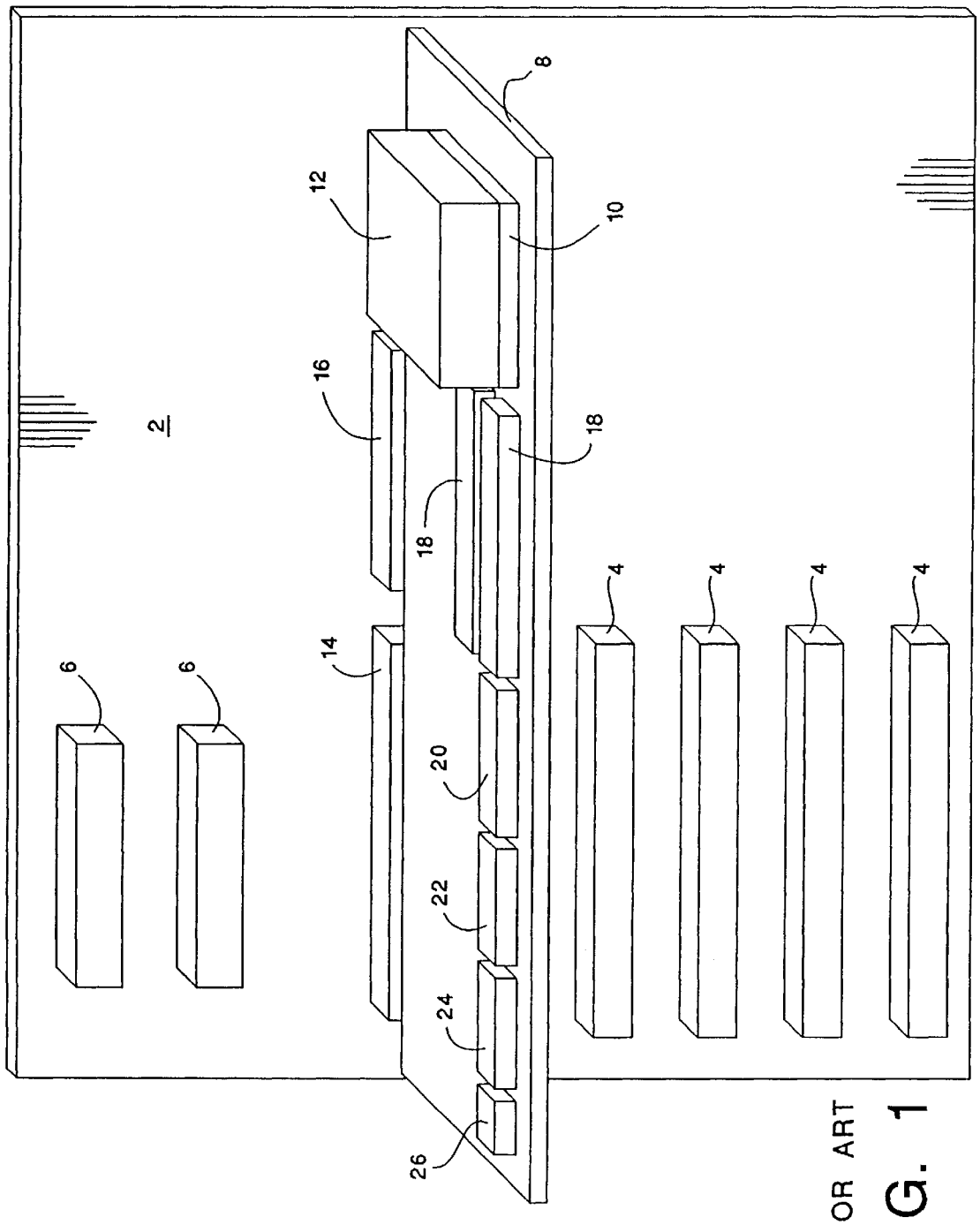
FIG. 1 is a pictorial view of a prior art passive backplane with a CPU (central processing unit) plugged into it.

Referring to FIG. 1, a prior art passive backplane 2 is shown to include a plurality of conventional ISA card-edge connectors 4 and a plurality of PCI card-edge connectors 6. Also shown is a CPU card 8 with a microprocessor 10 and fan 12 mounted thereon. The CPU card is plugged into both a conventional ISA connector 14 and a conventional PCI connector 16 per the PICMG standard. The backplane is usually affixed in a rack-mountable chassis (not shown). The CPU card is basically a single board computer with a microprocessor and commonly included features such as DIMM or SIMM connectors 18 for processor RAM memory, on-board I/O controllers and connectors for communicating with peripherals such as hard disks, floppy disks, printers and communications channels (20, 22, 24 and 26 respectively), control circuitry commonly referred to as a "processor chip set" (not shown), and associated oscillators and support circuitry (not shown).

Figure 2:
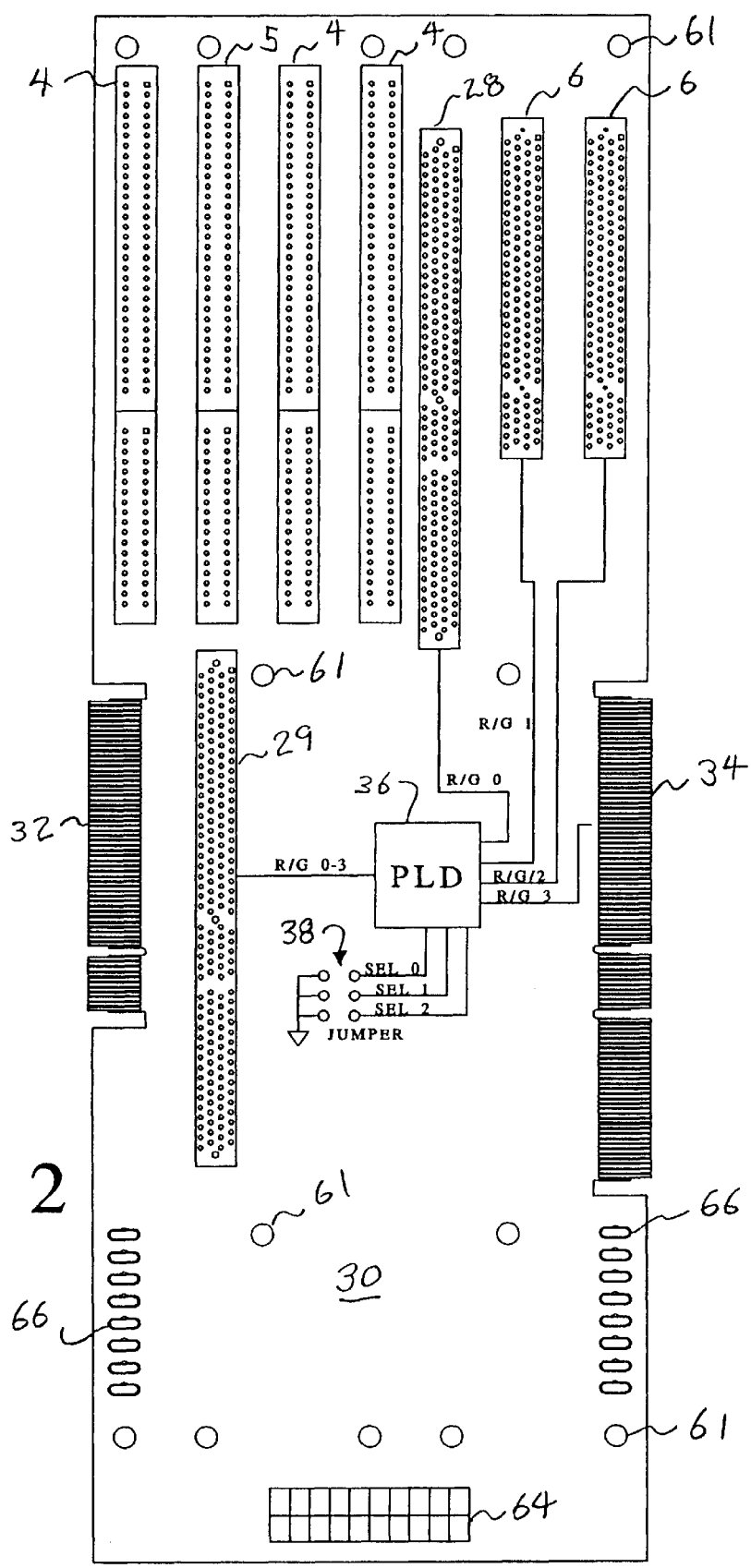
FIG. 2 is an elevational front view of a CPU module according to this invention.

Referring to FIG. 2, a printed circuit board CPU module 30 is illustrated to preferably have mounted thereon four orthogonally oriented ISA card-edge connectors, 4 and 5, two orthogonally oriented 32-bit PCI card-edge connectors 6, and two orthogonally oriented 64-bit PCI card-edge connectors, 28 and 29. These connectors are "orthogonally oriented" because they each have a slotted face into which a circuit card, edge terminal can be plugged, and the slotted faces are facing orthogonally away from the module board. Thus, a circuit card plugged into any of the connectors would be perpendicular to the module board. (For purposes of clarity, the card-edge slots of the connectors are not shown but rather the respective patterns of their back side pins by which the connectors communicate with the module board are shown.) As illustrated, ISA connector 5 and 64-bit PCI connector 29 are longitudinally aligned to mate with corresponding card-edge terminals of a CPU card (not shown), an example of which is item 8 of FIG. 1. From a plugged-in CPU card originates an ISA bus and a PCI bus, preferably a 64-bit PCI bus as illustrated. The plugged-in CPU card communicates ISA bus signals and PCI bus signals to and from the module board 30 via ISA connector S and PCI connector 29, respectively. The module board has signal lines coupling the ISA signals to the ISA connectors 4 and a card-edge terminal 32 defined by the module intermediate along its left edge. The module board also has signal lines coupling the PCI signals to the PCI connectors 6 and 28, and to a card-edge terminal 34 defined by the module intermediate along its right edge.

Referring again to FIG. 2, on-board the CPU module is also a programmable logic device (PLD) 36 which communicates with a jumper array 38. It should be noted that the PICMG standard for conventional PCI buses calls for four PCI request/grant pairs (R/G 0–3) which according to this invention are routed from connector 29 to the PLD and are distributed one pair each to the PCI connectors 6 and 28, and to the terminal 34. The jumper array and PLD cooperate to disable a selected one of the distributed request/grant pairs for a situation in which an adapter on-board the CPU card has already been assigned the request/grant pair. For example, if the CPU card has a PCI video controller on-board and the video controller uses R/G 0, then a user would configure the jumper array in such a manner to cause the PLD to reroute the R/G 0 signals to any unused PCI connector 6 or 28. In effect this provides the user a choice of which PCI connector to disable bus mastering. It is preferable, but nevertheless an option, that the request/grant pair going to the terminal 34 not be disabled since all PCI connectors chained to terminal 34, as explained below, will be disabled.

Figures 3, 4, 5:
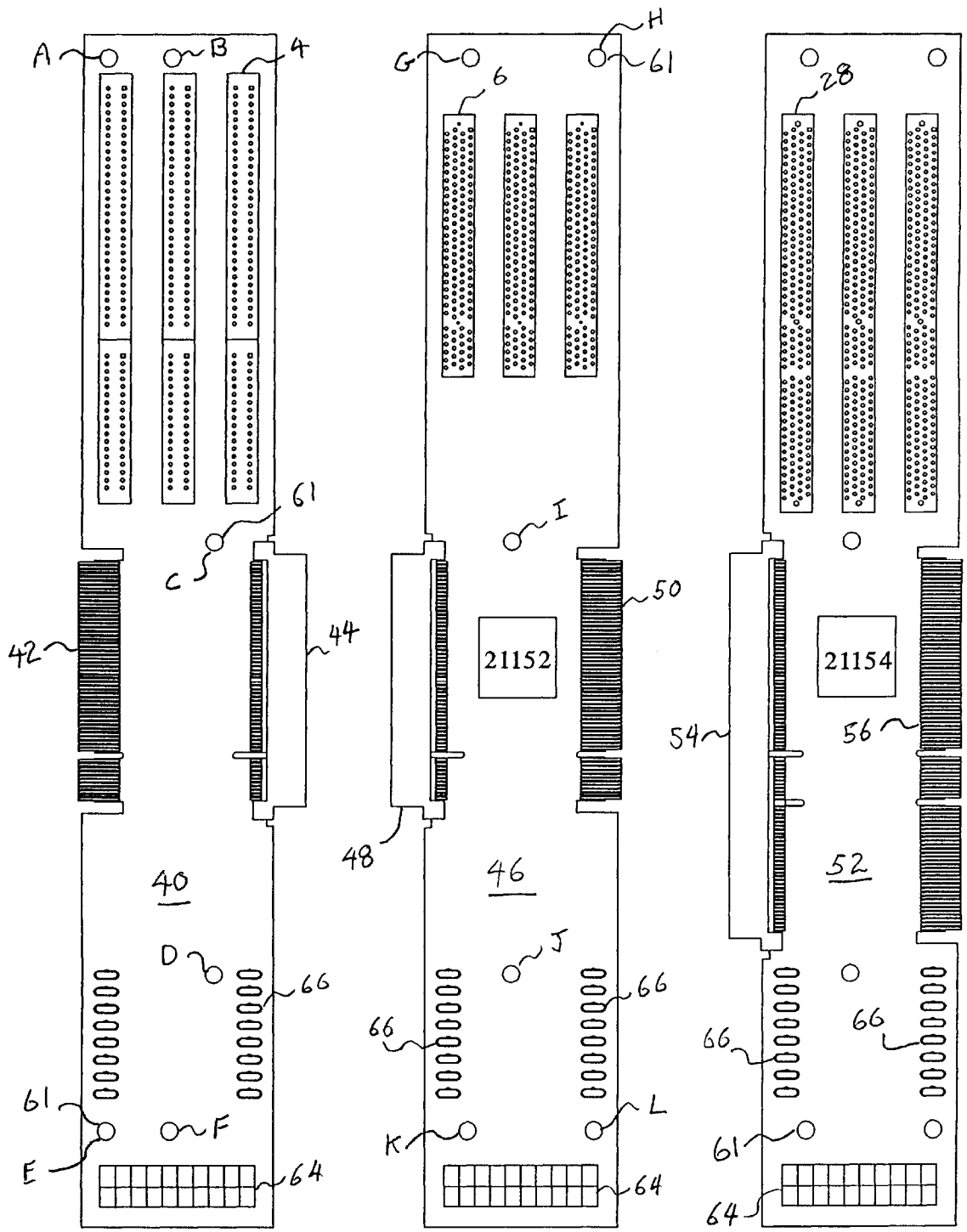
FIG. 3 is an elevational front view of an ISA module according to this invention.
FIG. 4 is an elevational front view of a 32-bit PCI module according to this invention.
FIG. 5 is an elevational front view of a 64-bit PCI module according to this invention.

Referring to FIGS. 2 and 3, a printed circuit board ISA module 40 is illustrated to have three orthogonally oriented ISA card-edge connectors 4. These ISA connectors communicate with a left-side edge terminal 42 and a right-side, edge oriented, card-edge connector 44. This module is used to extend the ISA bus originating on the CPU module 30 whenever connector 44 is mated with terminal 32 of the CPU module. Also, another ISA module 40 can mate its connector 44 with a preceding (closer to the CPU module) ISA module's terminal 42 to further extend the ISA bus.

Referring to FIGS. 2 and 4, a printed circuit board 32-bit PCI module 46 is shown to have three orthogonally oriented 32-bit PCI card-edge connectors 6 which communicate with a left-side, edge oriented, card-edge connector 48 and a right-side edge terminal 50. This module is used to extend the PCI bus originating on the CPU module 30 whenever connector 48 mates with terminal 34 of the CPU module. Likewise, another 32-bit PCI module 46 can mate with this module by mating its connector 48 with this module's terminal 50 to further extend the PCI bus.

Referring to FIGS. 2 and 5, a printed circuit board 64-bit PCI module 52 is illustrated to have three orthogonally oriented 64-bit PCI connectors 28 which communicate with an edge oriented, card-edge connector 54 on the left side and an edge terminal 56 on the right side. The left-side connector 54 is designed to mate with connector 34 of the CPU module 30 to extend the CPU module's 64-bit PCI bus. Likewise, an additional module 52 can be chained by mating its connector 54 to a preceding (closer to the CPU module) module's terminal 56. In addition, a 32-bit PCI module 46 can be chained to a 64-bit PCI module by mating its connector 48 with a corresponding portion of the preceding module's terminal 56. It should be noted that a 64-bit PCI module cannot be chained to a preceding 32-bit PCI module for two reasons. The 32-bit PCI module will not carry all the signals needed by the 64-bit PCI module, and the connectors will not mate.

Figure 6:
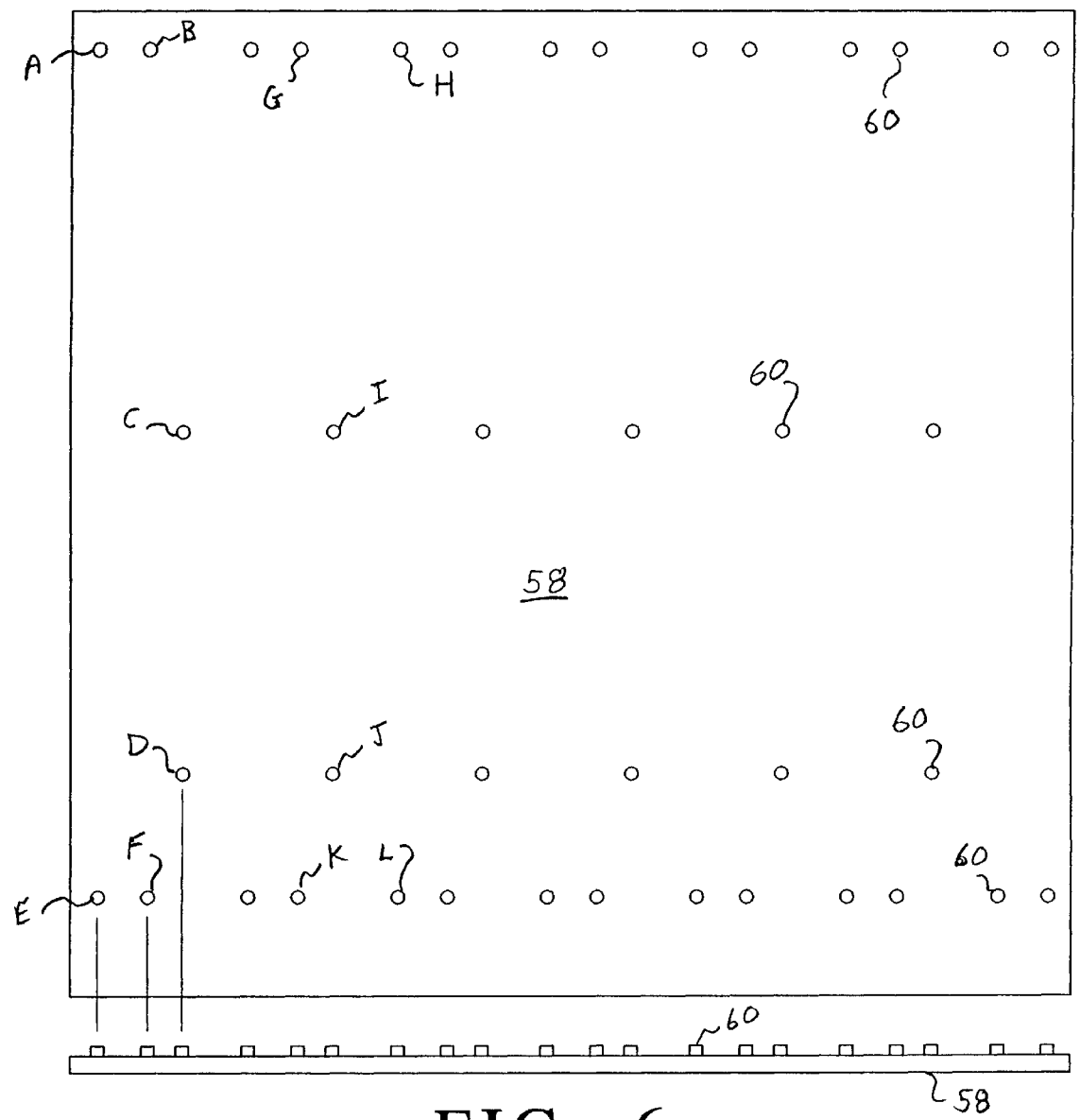
FIG. 6 are two views, top elevational and edge, of base plate according to this invention.

Referring to FIG. 6, a top and edge view of a rigid base plate 58 is illustrated to have a matrix of mounting posts 60. Preferably each of the mounting posts has a tapped bore (not shown) for receiving a fastener screw (not shown) used to secure the modules of this invention to the base plate. Preferably the base plate is cold rolled steel ASTM A591 to provide strong mechanical support for keeping the modules in a coplanar relationship, and to prevent the modules from suffering damage as circuit cards are plugged in and out of the orthogonally oriented connectors of the modules.

Referring to FIGS. 2–6, each of the modules of this invention has a plurality of mounting through-holes 61 disposed to register with a repeating pattern of base plate posts 60 such that each module can be mounted at a plurality of locations across the base plate 58. For example, the ISA module 40 has a through-hole pattern A-F which registers with a matching pattern A-F of posts which is repeated six times across the plate, and the PCI modules, 46 and 52, have a through-hole pattern G-L which registers with a matching pattern G-L of posts which is also repeated six times across the plate. The CPU module 30 has a pattern of through-holes 61 which allows it to be placed at five different locations across the plate.

Figure 7:
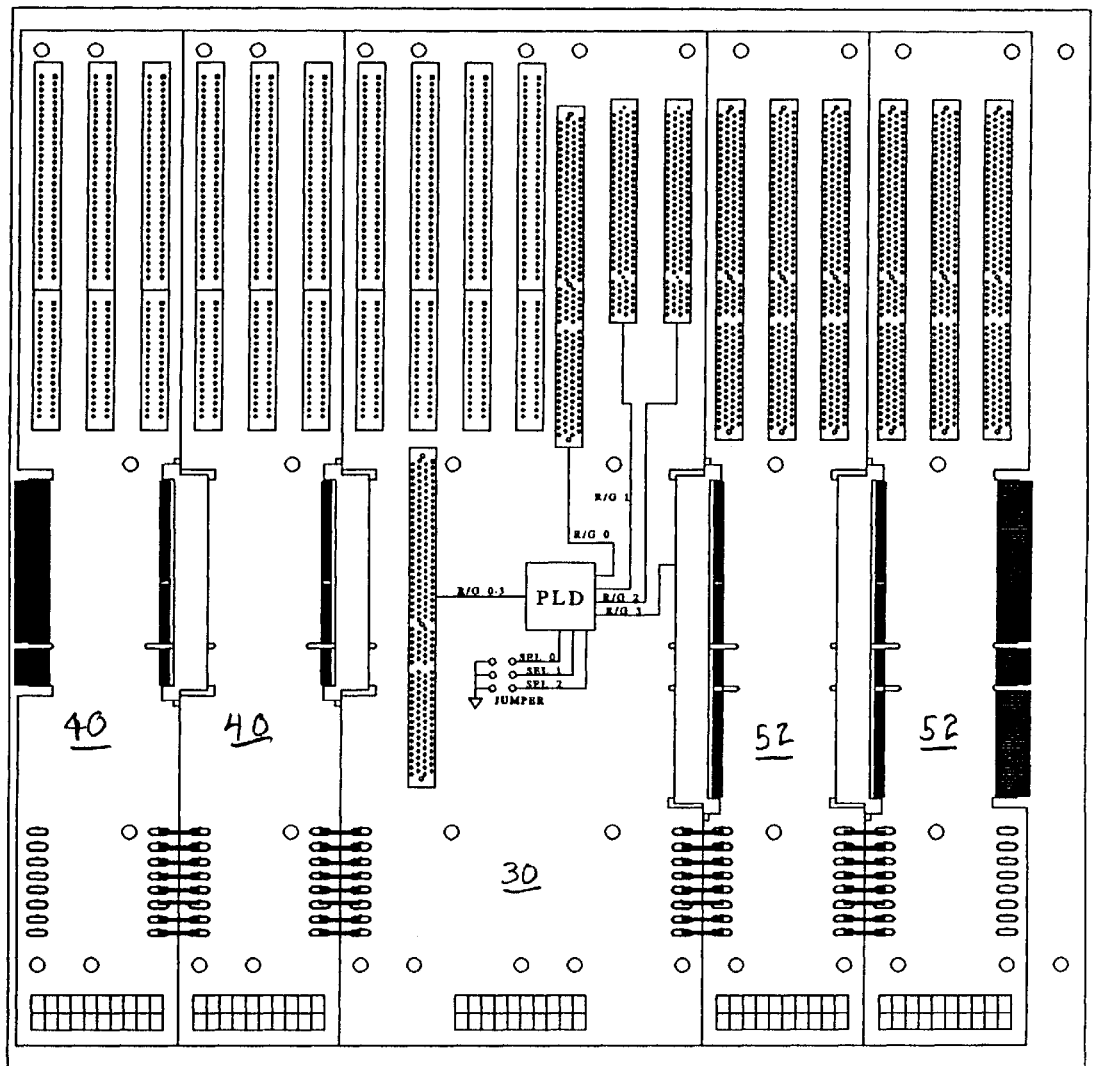
FIG. 7 is an elevational top view of a first exemplary backplane assembled from modules according to this invention and which are affixed to the base plate for mechanical support.

Referring to FIG. 7, one example of an assembled backplane according to this invention is illustrated to have a CPU module 30 roughly intermediate the left and the right extremes of the base plate 58. To the left of the CPU module is a two member chain of ISA modules 40. This ISA chain extends the ISA bus which originated on the CPU module to an additional six ISA connectors. To the right of the CPU module is a two member chain of 64-bit PCI modules which extend the 64-bit PCI bus which originated on the CPU module to another six connectors.

Figure 8:
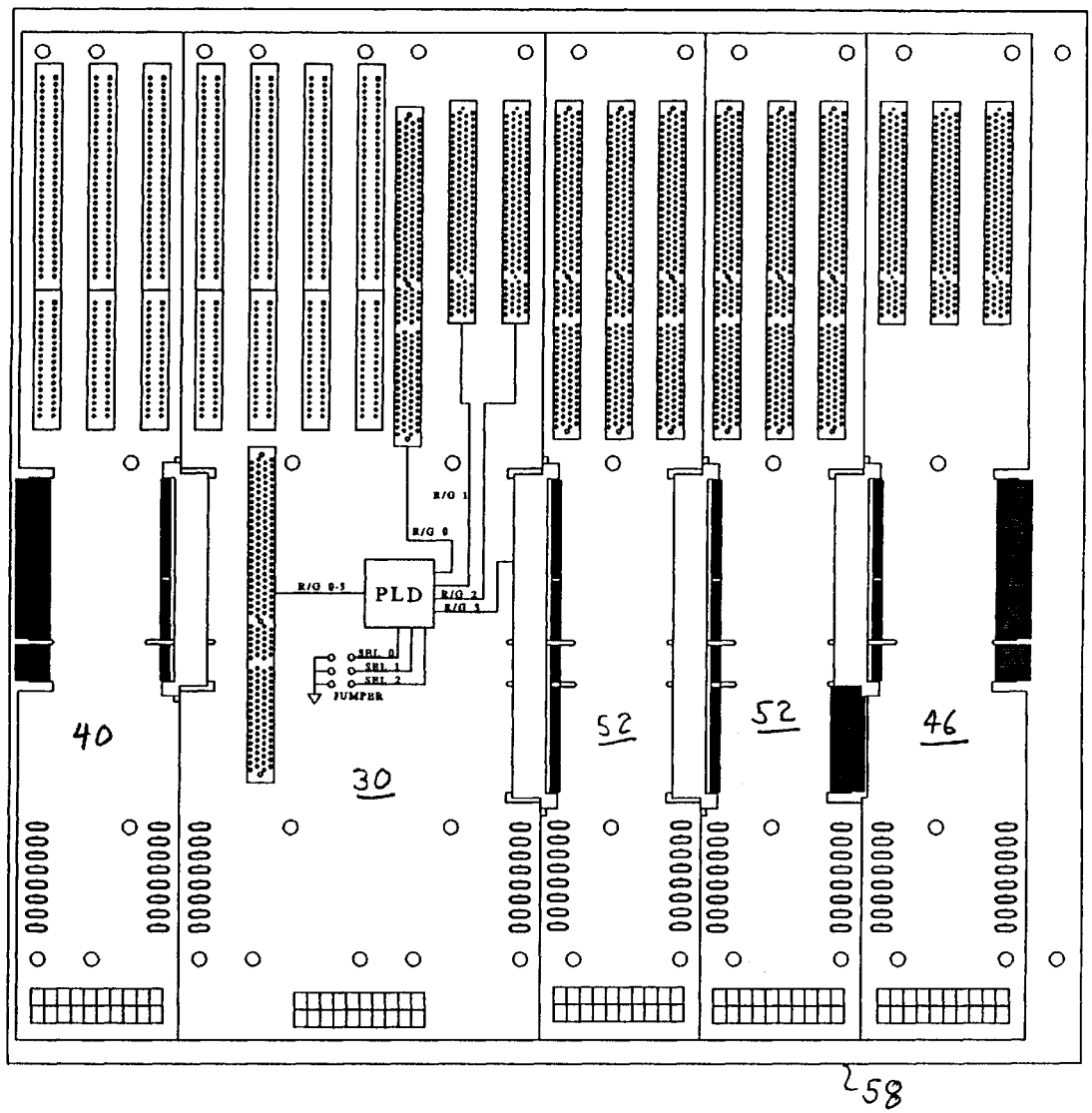
FIG. 8 is an elevational top view of a second exemplary backplane assembled from modules according to this invention and which are affixed to the base plate for mechanical support.

FIG. 8 illustrates another exemplary backplane according to this invention. In this example, the CPU module 30 has been moved left and only one ISA card 40 is chained to it. On the other hand, this frees up room on the right side of the CPU module for a third PCI module. In this example, there are two 64-bit PCI modules 52 chained to the CPU module, but at the end of the 64-bit PCI chain is a 32-bit PCI module 46, so the backplane of FIG. 8 has basically traded on ISA module for an additional PCI module over the backplane of FIG. 7.

Figure 9:
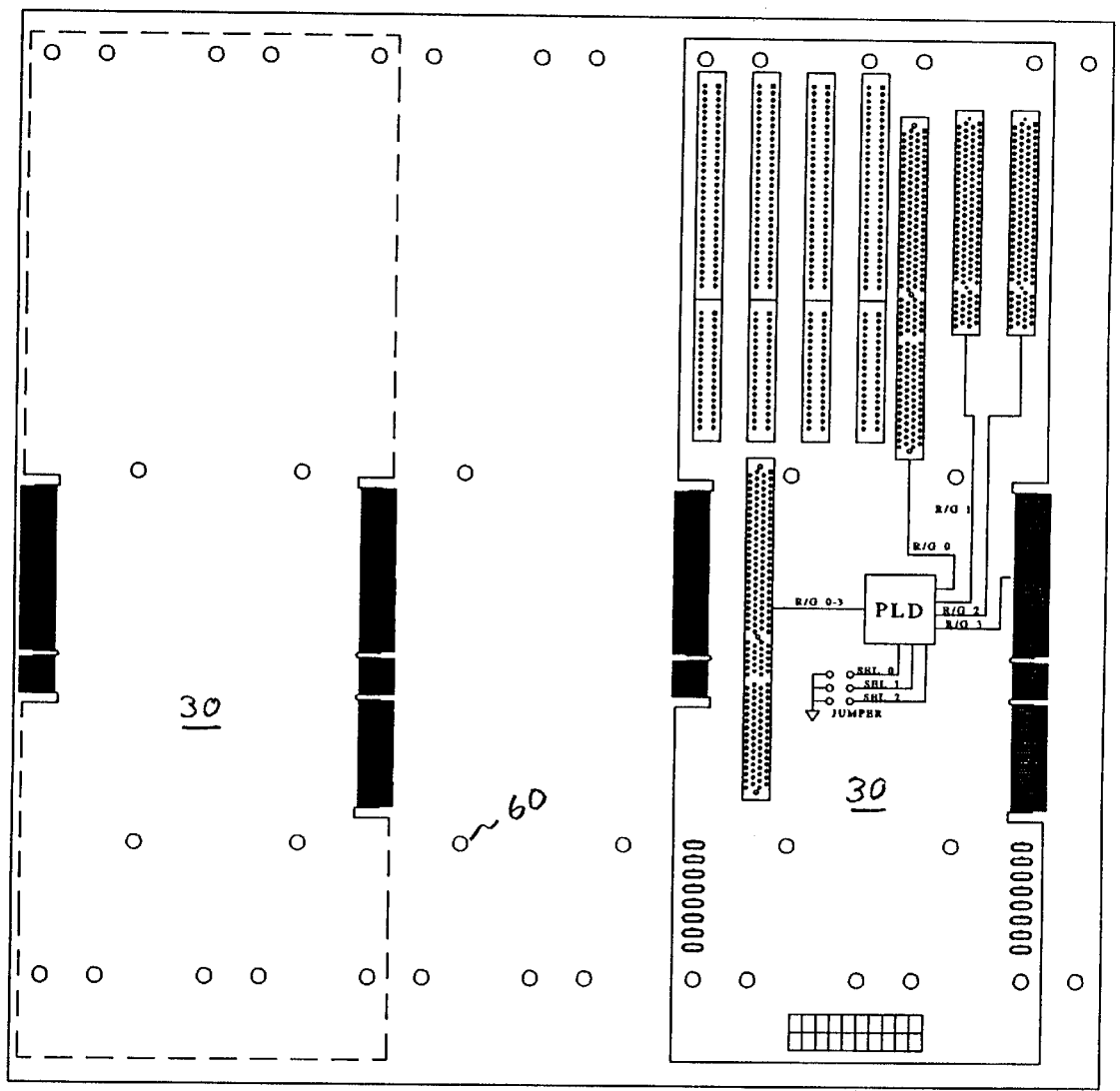
FIG. 9 is an elevational top view of a base plate showing other locations for mounting a CPU module, the phantom lines showing an extreme left location.

Referring to FIG. 9, the versatility of this invention is further illustrated. It can be seen that the CPU module can be mounted to the extreme right, as well as to the extreme left as opposed to its position in FIGS. 7 and 8. When the CPU module is to the extreme right four ISA modules can be chained to it. When the CPU module is to the extreme left four PCI modules can be chained to it. Also this figure illustrates that two CPU modules can be mounted simultaneously on the same base plate. This feature allows a user to have two separate computers, each with its own I/O buses, mounted in the same chassis.

Referring again to FIGS. 2–5 and 7, each of the modules has a power connector 64, preferably a conventional power connector used to power motherboards in personal computers, so that each module can be separately powered if it is desirable to do so. Each module also has two sets of jumper terminals along opposite lateral edges so that power and ground can be jumpered from one module to any adjacent module. As illustrated each jumper set comprises eight aligned sockets 66. Thus an assembled backplane can have one module directly connected to a power supply, preferably the CPU module, while the other modules receive power and ground indirectly through module-to-module jumpering. FIG. 7 illustrates all the modules being jumpered together so that a power connection can be made at any module. Also a backplane can be connected to more than one power supply assuming the supplies can be paralleled.

Figure 10:
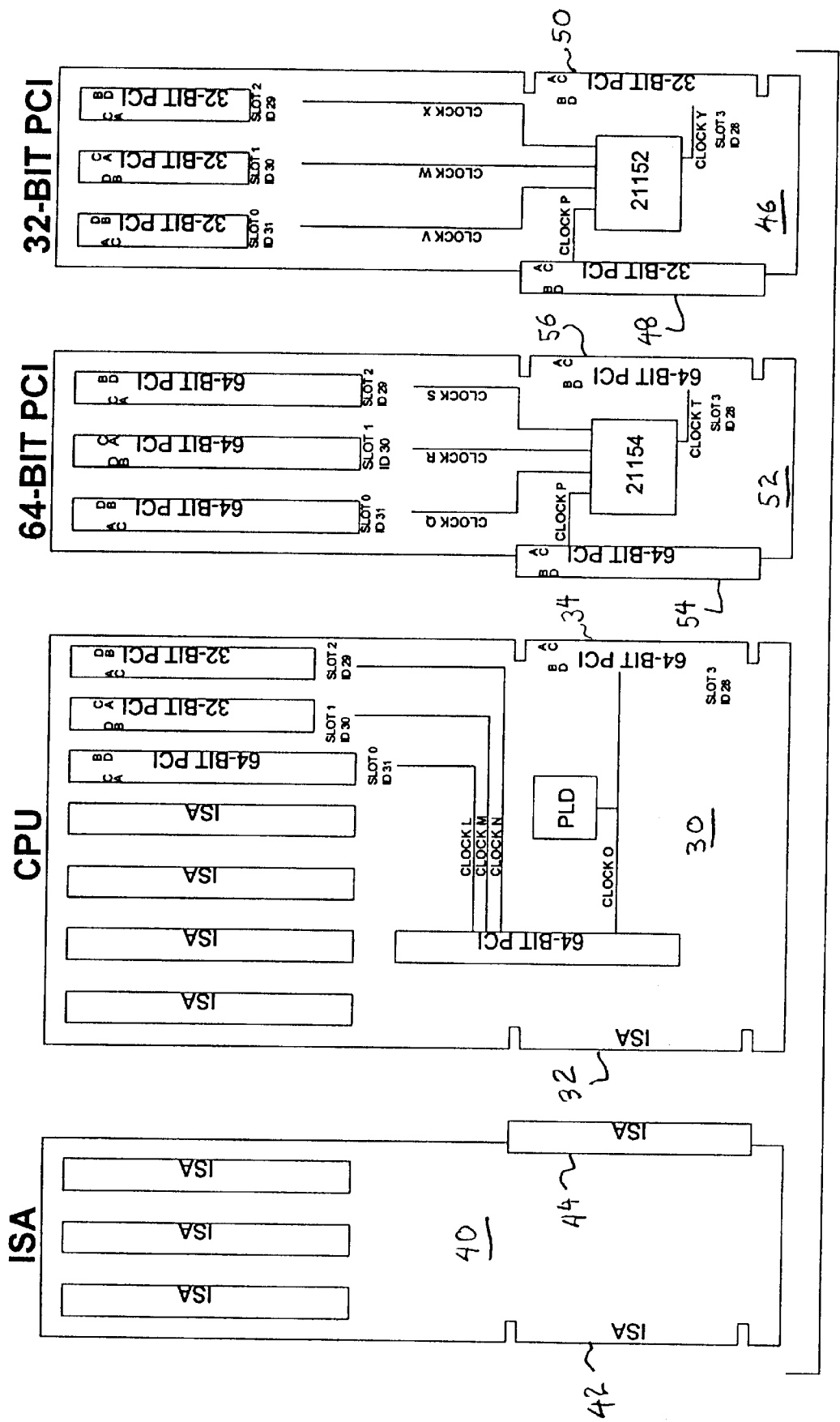
FIG. 10 is a diagrammatical representation of modules and the order in which they are connected.

Referring to FIG. 10, the 64-bit PCI modules and the 32-bit modules use integrated bridging circuits (21154 and 21152 respectively) because of the high bandwidth of the PCI bus. Also, the propagation delays of the PCI clocks are matched across module boundaries. For example, on the CPU module the propagation delay of clock L to slot 0 is equal to the delay of clock M to slot 1 and equal to the delay of clock N to slot 2. The delay of clock L is also equal to the sum of the delays of clocks O and P across the CPU/64-bit PCI module boundary to bridge 21154. On the 64-bit PCI module the delays of clocks Q, R and S are all equal, and they are also equal to the sum of the delays of clocks T and P across the 64-bit PCI/32-bit PCI module boundary to bridge 21152, and so on.

It should be noted that the position of the CPU module and the length of the ISA and PCI modules chained to it, is limited in these examples by the size of the base plate, but it should be understood that the a much wider base plate could be used thereby allowing a greater variation and number of chained modules. In fact, signal degradation due to accumulative capacitance and timing problems are the only practical limitations as to how many modules can be chained to the CPU module.

Preferably all the card-edge connectors for interconnecting the modules are PCI-type, straddle-mounted connectors, a 64-bit type for the 64-bit PCI modules and a 32-bit type for the ISA and 32-bit PCI modules. This is for uniformity and costs savings. However, other kinds of connectors can be used as long as they have the signal density and electrical characteristics suitable for the signals passing through them.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as defined by the following claims.

We claim:

1. For a processor card having a connector by which it couples to a backplane and through which it communicates one or more separate input/output signal buses to the backplane, and one or more add-on cards each having a connector by which said each couples to a backplane and through which said each communicates with an input/output signal bus from the backplane, a set of modules from which a novel backplane can be selectively assembled comprising:

(a) a first module comprising:
   (1) a board,
   (2) a connector mounted on the board for mating with the processor card's backplane connector to communicate an input/output signal bus onto the board,
   (3) an intermodule connector disposed along an edge of the board, and
   (4) a plurality of signal lines traversing the board for carrying the input/output signal bus to the board's intermodule connector;

(b) a second module comprising:
   (1) a board,
   (2) an intermodule connector, disposed along an edge of the second module's board, for engaging the first module's intermodule connector to couple the first and second modules in juxtaposed coplanar relation, the coupling communicating the input/output signal bus onto the second module's board,
   (3) at least one connector mounted on the second module's board for mating with an add-on card's backplane connector, and
   (4) a plurality of signal lines traversing the second module's board for carrying the input/output signal bus to said at least one connector; and (c) means for fixing the set of modules in coplanar relation.

2. The module set according to claim 1 further comprising a second intermodule connector disposed on the second module's board along an edge opposite said board's first intermodule connector, the second intermodule connector communicating with the input/output signal bus traversing the second module's board; the second intermodule connector enabling multiple second modules to be chained planarly together, each second module in the chain receiving the input/output bus signals via its coupling to either the first module or an immediately preceding second module.

3. The module set according to claim 2 further comprising a fourth module comprising:
   (a) a board;
   (b) an intermodule connector, disposed along an edge of the fourth module's board, for engaging the first module's intermodule connector to couple the first and fourth modules in juxtaposed coplanar relation, the coupling communicating a subset of the input/output signal bus onto the fourth module's board,
   (c) at least one connector mounted on the fourth module's board for mating with an add-on card's backplane connector; and
   (d) a plurality of signal lines traversing the fourth module's board for carrying the subset of the input/output signal bus to said at least one connector.

4. The module set according to claim 2 further comprising:
   (a) a rigid plate including a face of sufficient area to be at least coextensive with a plurality of selectable assemblages of the other module types, and
   (b) means for affixing each selected assemblage to the face of the plate.

5. The module set according to claim 4 further comprising:
   (a) respective patterns of mounting holes defined by each first, second, third and fourth module, and
   (b) mounting posts affixed to the rigid plate and so disposed that the holes of each of said respective patterns all register with mounting posts at a plurality of locations across the rigid plate, to allow each first, second, third and fourth modules to be mounted at multiple locations across the plate.

6. The module set according to claim 3 further comprising a second intermodule connector disposed on the fourth module's board along an edge opposite said board's first intermodule connector, the second intermodule connector communicating with the subset of the input/output signal bus traversing the fourth module's board, the second intermodule connector enabling multiple fourth modules to be chained planarly together, each fourth module in the chain receiving the subset of the input/output bus signals via its coupling to either the first module or an immediately preceding fourth module.

7. The module set according to claim 6 wherein a chain of fourth modules can be coupled to a second module's second intermodule connector to receive the subset of the input/output bus via the second module's second intermodule connector.

8. The module set according to claim 3 further comprising:
   (a) a rigid plate including a face of sufficient area to be at least coextensive with a plurality of selectable assemblages of the other module types, and
   (b) means for affixing each selected assemblage to the face of the plate.

9. The module set according to claim 8 further comprising:
   (a) respective patterns of mounting holes defined by each first, second, third and fourth module, and
   (b) mounting posts affixed to the rigid plate and so disposed that the holes of each of said respective patterns all register with mounting posts at a plurality of locations across the rigid plate, to allow each first, second, third and fourth modules to be mounted at multiple locations across the plate.

10. The module set according to claim 3 wherein a fourth module can be coupled in juxtaposed coplanar relation to a second module's second intermodule connector to receive the subset of the input/output bus via the second module's second intermodule connector.

11. The module set according to claim 3 wherein the input/output bus comprises a personal computer 64-bit PCI bus, and the subset of the input/output bus comprises a 32-bit PCI bus.

12. The module set according to claim 11 further comprising a PCI bridging circuit on each second and fourth modules for coordinating the timing of clocks signals associated with the PCI buses.

13. The module set according to claim 1 wherein the first module's connector for mating with the processor card's backplane connector communicates from the processor card a second input/output signal bus, and wherein the set of modules further comprises:
   (a) a second intermodule connector disposed on the first module's board along an edge opposite said board's first intermodule connector, and
   (b) a second plurality of signal lines traversing the first module's board for carrying the second input/output signal bus to said board's second intermodule connector.

14. The module set according to claim 13 further comprising:
   (a) a third module comprising:
      (1) a board;
      (2) an intermodule connector, disposed along an edge of the third module's board, for engaging the first module's second intermodule connector to couple the first and third modules in juxtaposed coplanar relation, the coupling communicating the second input/output signal bus onto the third module's board;
      (3) at least one connector mounted on the third module's board for mating with an add-on card's backplane connector; and
      (4) a plurality of signal lines traversing the third module's board for carrying the second input/output signal bus to said at least one connector.

15. The module set according to claim 14 further comprising a second intermodule connector disposed on the third module's board along an edge opposite said board's first intermodule connector, the second intermodule connector communicating with the second input/output signal bus traversing the third module's board, the second intermodule connector enabling multiple third modules to be chained planarly together, each third module in the chain receiving the second input/output bus signals via its coupling to either the first module or an immediately preceding third module.

16. The module set according to claim 15 further comprising a separate power connection for each module.

17. The module set according to claim 15 further comprising jumper means for jumping power and ground from each module to an adjacent module.

18. The module set according to claim 14 further comprising:
   (a) a rigid plate including a face of sufficient area to be at least coextensive with a plurality of selectable assemblages of the other module types, and
   (b) means for affixing each selected assemblage to the face of the plate.

19. The module set according to claim 18 further comprising:
   (a) respective patterns of mounting holes defined by each first, second, third and fourth module, and
   (b) mounting posts affixed to the rigid plate and so disposed that the holes of each of said respective patterns all register with mounting posts at a plurality of locations across the rigid plate, to allow each first, second, third and fourth modules to be mounted at multiple locations across the plate.

20. The module set according to claim 13 wherein the second input/output bus comprises a personal computer ISA bus.

21. The module set according to claim 1 wherein the input/output bus comprises a personal computer 64-bit PCI bus.

22. The module set according to claim 21 wherein each first module further comprises:
   (a) a plurality of PCI add-on card connectors mounted on each first module's board,
   (b) a plurality of signal lines routing PCI request/grant signal pairs from the processor card connector to a selection circuit, and
   (c) a plurality of signal lines routing outputs of the selection circuit, one each, to the PCI add-on card connectors and to the first module's intermodule connector, each output being a request/grant pair which, in responsive to an operator selection input, can be disabled by the selection circuit.

* * * * *